United States Patent
Faust et al.

(10) Patent No.: US 6,927,159 B2
(45) Date of Patent: Aug. 9, 2005

(54) METHODS FOR PROVIDING IMPROVED LAYER ADHESION IN A SEMICONDUCTOR DEVICE

(75) Inventors: Richard Allen Faust, Dallas, TX (US); Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/446,898

(22) Filed: May 27, 2003

(65) Prior Publication Data

US 2004/0241979 A1 Dec. 2, 2004

(51) Int. Cl.⁷ .......................................... H01L 21/4763
(52) U.S. Cl. ...................... 438/628; 438/625; 438/642; 438/644
(58) Field of Search ............................... 438/625, 628, 438/642, 644, 645

(56) References Cited

U.S. PATENT DOCUMENTS

| | | | | |
|---|---|---|---|---|
| 6,136,682 A | * | 10/2000 | Hegde et al. | 438/622 |
| 6,146,993 A | * | 11/2000 | Brown et al. | 438/627 |
| 6,150,259 A | * | 11/2000 | Wu et al. | 438/628 |
| 6,283,835 B1 | * | 9/2001 | Harada et al. | 451/41 |
| 6,465,867 B1 | * | 10/2002 | Bernard et al. | 257/520 |
| 6,498,091 B1 | * | 12/2002 | Chen et al. | 438/627 |
| 6,522,013 B1 | * | 2/2003 | Chen et al. | 257/774 |
| 6,780,764 B2 | * | 8/2004 | Morita et al. | 438/656 |
| 2002/0197850 A1 | * | 12/2002 | Ahn et al. | 438/635 |
| 2003/0139034 A1 | * | 7/2003 | Yuang | 438/634 |
| 2003/0236003 A1 | * | 12/2003 | Koo et al. | 438/795 |
| 2004/0023497 A1 | * | 2/2004 | Pan et al. | 438/694 |

* cited by examiner

Primary Examiner—Christian Wilson
(74) Attorney, Agent, or Firm—Peter K. McLarty; W. James Brady, III; Frederick J. Telecky, Jr.

(57) ABSTRACT

According to one embodiment of the invention, a method for providing improved layer adhesion in a semiconductor is provided. The method includes forming a dielectric layer. The method also includes forming a layer of metal in direct contact with the dielectric layer. The method also includes directly exposing the layer of metal, after forming the layer of metal, to plasma at a power level sufficient to penetrate through the layer of metal and reach the dielectric layer.

3 Claims, 6 Drawing Sheets

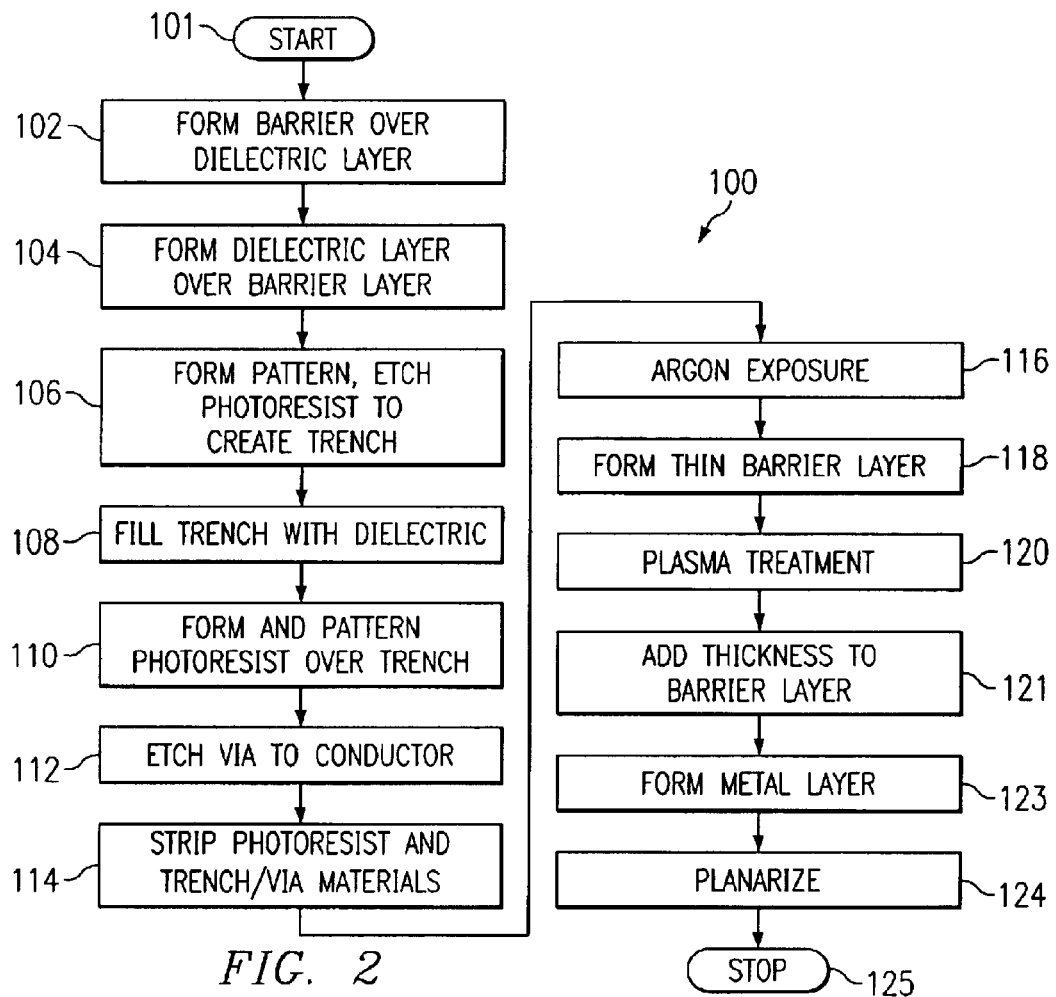
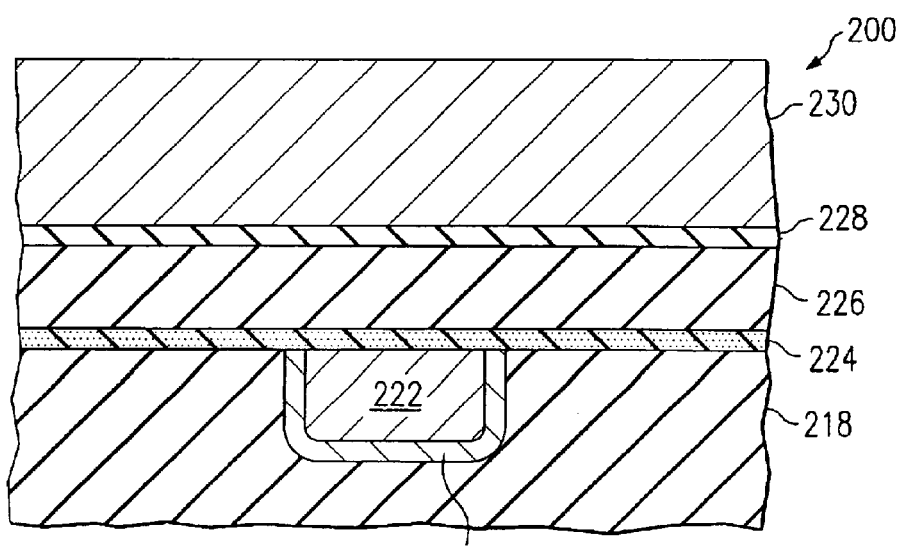

METHODS FOR PROVIDING IMPROVED LAYER ADHESION IN A SEMICONDUCTOR DEVICE

TECHNICAL FIELD OF THE INVENTION

This invention relates generally to electronic devices and more particularly to methods for providing improved layer adhesion in a semiconductor device.

BACKGROUND OF THE INVENTION

Semiconductor devices are prevalent in countless different aspects of contemporary society, and as a result, the marketplace for such devices continues to advance at a fairly rapid pace. This advancement is evident in many respects and relates to semiconductor devices either directly or indirectly as well as the methods for forming such devices. For example, the advancement affects numerous device attributes and increases the need for attention to such attributes during design and manufacturing, where such attributes include device size, reliability, yield, and cost.

Some semiconductor manufacturing techniques relate to adhesion to dielectric layers in semiconductor devices. More specifically, some semiconductor manufacturing techniques relate to a dielectric layer that includes silicon, carbon, and oxygen and the adhesion of such a layer to a barrier layer that is to operate as a barrier between the dielectric layer and a metal, such as copper. Turning first to the dielectric layer having silicon, carbon, and oxygen, such materials are sometimes combined in a film known as organo-silicate glass ("OSG"), which is commercially available from Novellus and Applied Materials. OSG layers are attractive for various reasons, such as a favorable (i.e., relatively low) dielectric constant. Turning next to copper, its use favored, particularly as an interconnect metal, because relative to previously used metals, such as aluminum, copper provides lower resistance and, hence, greater reliability.

When interconnect metal, such as copper, is used in the same device as an OSG layer, a barrier layer may be provided between the copper and OSG. The barrier layer prevents or reduces the undesirable chance of metal diffusion into the dielectric. However, when placing a barrier layer between the OSG and interconnect metal, the adhesion of the barrier layer to the OSG may be unacceptable. Such adhesion has been empirically evaluated using several known testing techniques, and those techniques have demonstrated that the barrier layer may detach from the OSG, thereby failing to serve its underlying purpose as a barrier to a subsequently-formed metal layer/device. Tape testing has been used, wherein a semiconductor wafer, on which a barrier layer is formed on an OSG layer, is scribed and then tape is applied to the wafer and removed to determine if the layers remain intact. Under such testing, cracks have been found to form at the interface of the barrier layer and the OSG layer, thereby demonstrating qualitatively that the bond between the two layers is unacceptable. In another test, chemical mechanical polishing ("CMP") was applied to the above-described wafer. This test is sometimes preferred in that it represents an actual manufacturing step, since CMP is often used to planarize various layers before subsequent processing steps. In any event, under CMP, failures between an adjacent OSG and barrier layer have also been observed.

SUMMARY OF THE INVENTION

According to one embodiment of the invention, a method for providing improved layer adhesion in a semiconductor is provided. The method includes forming a dielectric layer. The method also includes forming a layer of metal in direct contact with the dielectric layer. The method also includes directly exposing the layer of metal, after forming the layer of metal, to plasma at a power level sufficient to penetrate through the layer of metal and reach the dielectric layer.

Some embodiments of the invention provide numerous technical advantages. Some embodiments may benefit from some, none, or all of these advantages. For example, according to one embodiment, the adhesion between two layers of a semiconductor device is improved. In another embodiment, the cost of semiconductor manufacturing is lowered by using existing systems to improve adhesion between layers. In another embodiment, the reliability of semiconductor devices having damascene structures is increased by improving the adhesion between a barrier layer and a dielectric layer.

Other technical advantages may be readily ascertained by one readily skilled in the art.

BRIEF DESCRIPTION OF THE DRAWINGS

Reference is now made to the following description taken in conjunction with the accompanying drawings, wherein like reference numbers represent like parts, in which:

FIG. 2 is a flow chart illustrating one embodiment of a method for providing improved layer adhesion according to the teachings of the present invention; and FIGS. 3A–3I are a series of cross-sectional diagrams illustrating one embodiment of a semiconductor device constructed according to the teachings of the present invention.

DETAILED DESCRIPTION OF EXAMPLE EMBODIMENTS OF THE INVENTION

Embodiments of the invention are best understood by referring to FIGS. 1 through 3I of the drawings, like numerals being used for like and corresponding parts of the various drawings.

Figure 1:
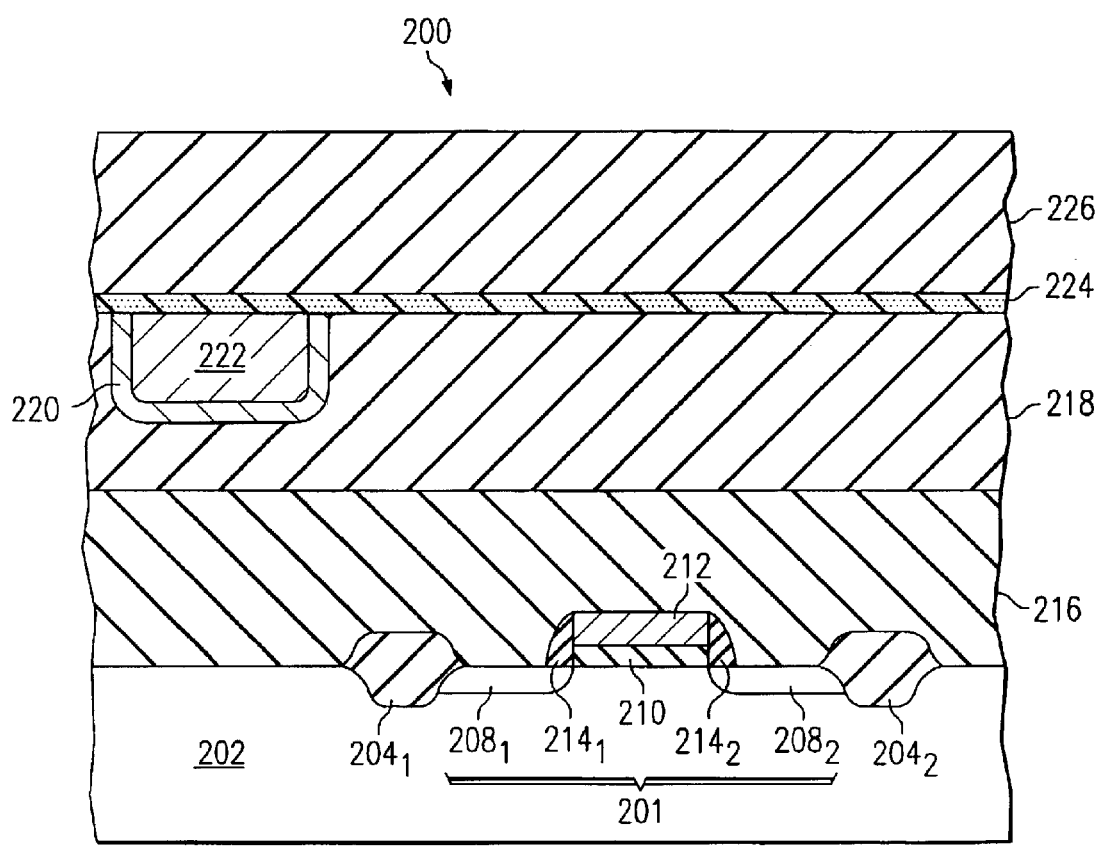
FIG. 1 illustrates a cross-sectional view of a portion of a semiconductor device that may benefit from the teachings of the present invention.

FIG. 1 is a cross-sectional diagram of a semiconductor device 200 that may benefit from the teachings of the present invention. Device 200 includes various device components that are formed as is known in the art, and which may form various devices, such as a transistor, as shown by way of example formed in connection with an active area 201 formed in a substrate 202, such as silicon. Substrate 202 is part of, or represents, a semiconductor wafer providing the foundation for device 200. Active area 201 is generally defined between isolation regions $204_1$ and $204_2$. Within active area 201, source and drain regions $208_1$ and $208_2$, a gate dielectric 210, a conductive gate 212, and sidewall insulators $214_1$ and $214_2$ are formed, thereby creating a transistor, by way of example. A dielectric layer 216 is formed overlying the transistor shown therein and is planarized. Dielectric layer 216 therefore overlies the portion of the device containing active (and possibly passive) components formed as is known in the art. A second dielectric layer 218 is shown to overlie dielectric layer 216, although in fact layers 216 and 218 may be one layer.

Multiple levels of interconnect structure may be formed and may connect to one another and also to various components formed in relation to substrate 202. Due to the many possibilities of the connections that may be achieved by such interconnect structures and the components to which they may connect, considerable extra detail is not necessary with respect to a specific connection as it may be readily ascertained by one skilled in the art. Thus, only a particular example is provided below merely to demonstrate a context and not by way of limitation for the intended inventive scope. For the specific example, a liner/barrier layer 220 is formed within a trench structure formed in dielectric layer 218. Liner/barrier layer 220 may be formed from one of various materials, including tantalum, tantalum nitride, titanium nitride, titanium-silicon-nitride, tungsten, tungsten nitride, and any other suitable material capable of blocking diffusion of interconnect material into dielectric layer 218. A conductor 222 is formed to align with liner/barrier 220 and is planarized along the top surface of dielectric layer 218. By way of example, conductor 222 is copper, although it may be formed from any other suitable conductive materials. A non-conducting barrier layer 224, often referred to as an etch stop layer and commonly on the order of a few hundred angstroms of silicon nitride or another dielectric barrier material, may be formed over dielectric layer 218 and, thus, also over the top of conductor 222.

A dielectric layer 226 may be formed over barrier layer 224. This dielectric layer 226 may be deposited by chemical vapor deposition ("CVD"), spin on process, or any other suitable deposition process. The thickness of dielectric layer 226 is based upon performance requirements. Dielectric layer 226 may have a relatively low dielectric constant and may be formed from a suitable dielectric material, such as OSG. For sake of simplified reference, for the remainder of this document dielectric layer 226 is referred to as OSG layer 226.

Conventionally, a void may be patterned and etched through layers 226, 224, and any other layers that may overlie layer 226 to expose the surface of conductor 222. The void may be subsequently filled with a conductive material, such as copper, to provide an electrical connection between conductor 222 and another conductor that is positioned in a layer overlying layer 218. A liner is often used to provide a barrier between layer 226 and the conductive material that is used to fill the void. The barrier is provided so that any diffusion from the conductive material into OSG layer 226 may be blocked. However, the adhesion between OSG dielectric layer 226 and the barrier, which is typically an conductive material, may be poor. As a result, a conductive barrier used to line the void defined in OSG layer 226 may be separated from the wall of the void. Such a separation may result in the uprooting of substantially all of the conductive material that is used to fill the void. Thus, the poor adhesion of the barrier material and OSG layer 226 decreases the reliability of device 200.

According to some embodiments of the present invention, methods for providing improved layer adhesion in a semiconductor device are provided. In one embodiment, the adhesion between a dielectric layer and a barrier layer in a damascene structure is improved. In another embodiment, the cost of semiconductor manufacturing is lowered by using existing systems to improve adhesion between layers of a semiconductor device. In another embodiment, the reliability of semiconductor devices having one or more damascene structures is increased by improving the adhesion between the barrier layer and the dielectric layer. Some embodiments may benefit from some, none, or all of these advantages. Additional details of example embodiments of the methods are provided below in conjunction with FIGS. 2 through 3I.

FIG. 2 is a flow chart illustrating one embodiment of a method 100 for providing improved layer adhesion in a semiconductor device. To further illustrate method 100 and the device that it forms, the various steps of method 100 are described below in conjunction with FIGS. 3A through 3I. By way of further introduction, FIGS. 3A through 3I illustrate cross-sectional views of a dual damascene structure constructed according to the teachings of the present invention. A damascene structure often refers to a structure having a conductive material embedded into a layer, where the conductive material is separated from the layer by a barrier layer. Thus, a dual damascene structure refers to a damascene structure that is stacked on top of another damascene structure. By way of example, a dual damascene structure includes a generally vertical void connecting an upper and a lower layer, often referred to as a "via." A dual damascene structure also includes a generally horizontal and often wider void in the upper layer often referred to as a trench. The dual damascene process is known in the art, and indeed it may be achieved with different steps, or with comparable steps in varying orders, and sometimes with or without certain barrier layers.

Referring to FIGS. 2 and 3A, method 100 starts at step 101. At step 102, a barrier layer 228 may be formed overlying OSG layer 226; however, step 102 and layer 228 may be omitted in some embodiments. Barrier layer 228, by way of example, may be formed in the same or a similar manner as barrier layer 224 and, thus, may be formed as an etch stop layer typically on the order of a few hundred angstroms of silicon nitride. At step 104, a dielectric layer 230 may be formed over barrier layer 228. In one embodiment, dielectric layer 230 may be formed from any suitable dielectric material, such as OSG. The thickness of dielectric layer 230 may be the same or different from that of dielectric layer 226. Also for sake of reference, in the remainder of this document dielectric layer 230 is referred to as OSG layer 230.

Figure 3B:
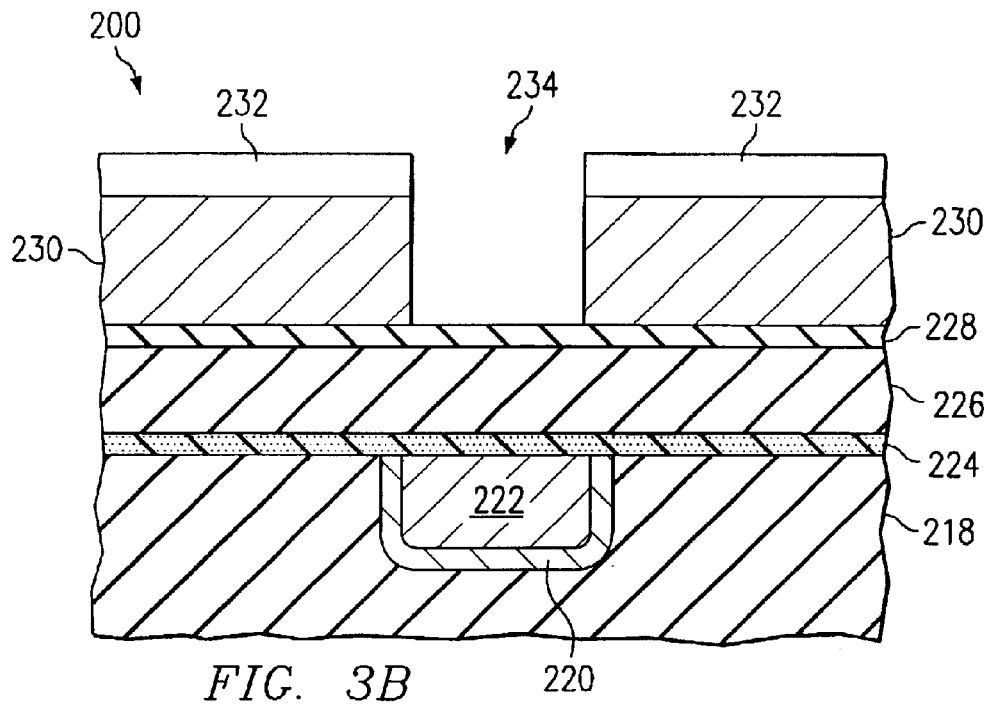

Referring to FIGS. 2 and 3B, at step 106, a photoresist layer 232 overlying OSG layer 230 is formed, patterned and etched. Performing step 106 results in a first void 234, referred to as a trench 234, through OSG layer 230. The etching process at step 106 stops at barrier (or etch stop) layer 228. In one embodiment, trench 234 is patterned and etched so that trench 234 at least partly overlies conductor 222.

Figure 3C:
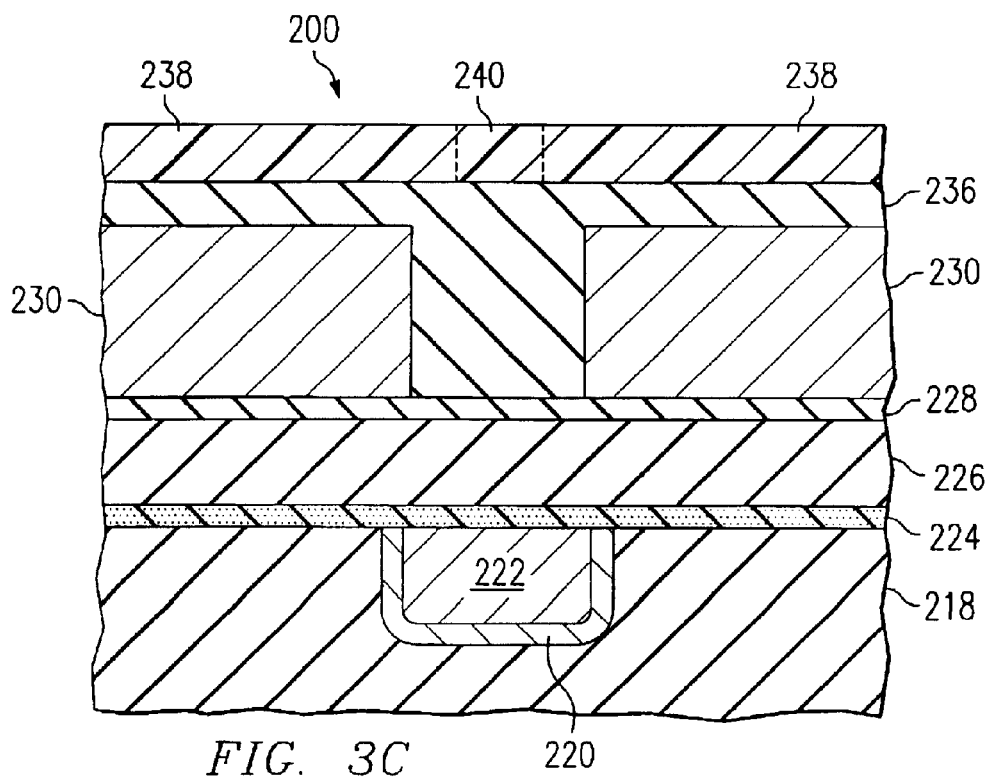

Referring to FIGS. 2 and 3C, at step 108, the remainder of photoresist layer 232 from FIG. 3B may be stripped (with an appropriate cleaning step, if desired), and an additional dielectric layer 236 is formed over OSG layer 230 and so that it fills trench 234, which was shown in FIG. 3B. At step 110, another photoresist layer 238 is formed and patterned. Photoresist layer 238 is patterned such that an area 240 may be removed in a subsequent etch, as described below. Area 240 at least partly overlies conductor 222 and trench 234, which was filled with dielectric layer 236.

Figure 3D:
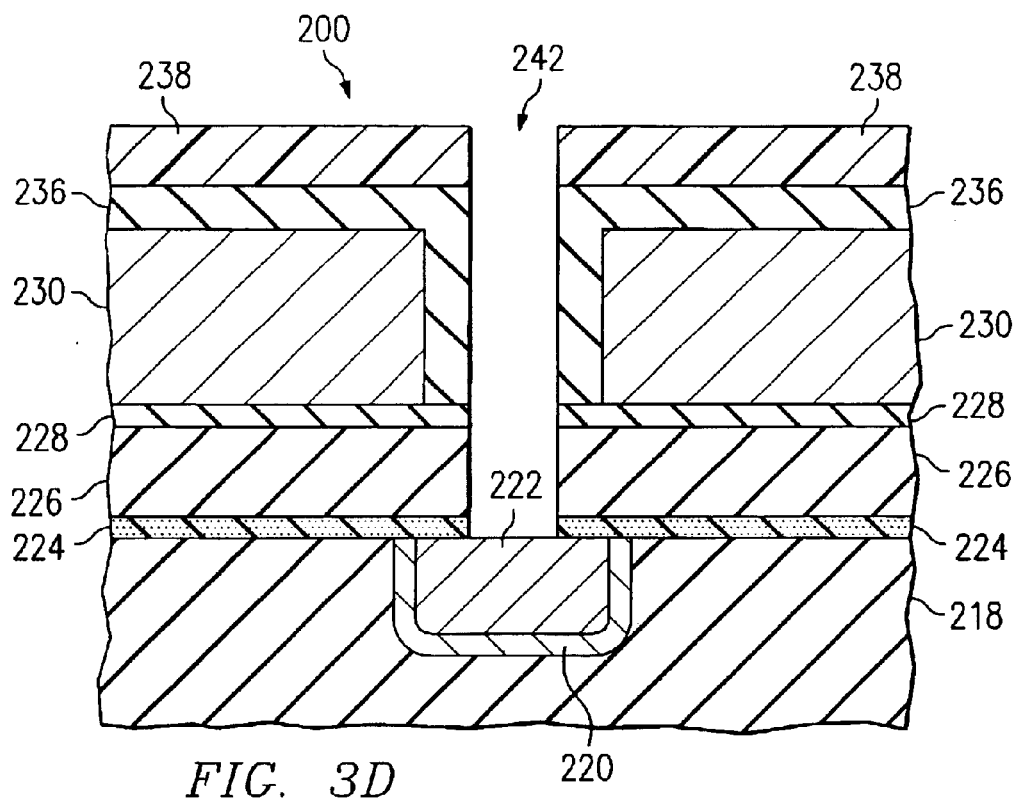

Referring to FIGS. 2 and 3D, at step 112, photoresist layer 238 is etched such that area 240 is removed, and the etch continues to create a void 242 through dielectric layer 236, barrier layer 228, OSG layer 226, and barrier layer 224, as shown in FIG. 3D; Thus, the etch reaches the upper surface of conductor 222. In the example shown in FIG. 3D, the portion of void 242 defined by OSG layer 226 is referred to as "via."

Figure 3E:
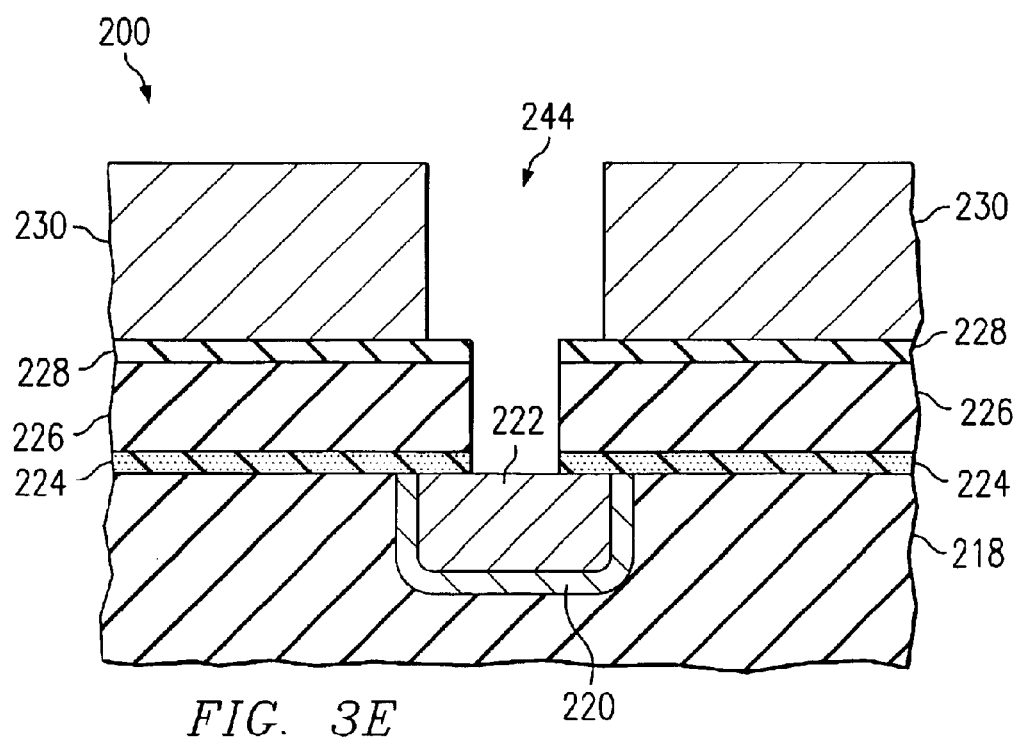

Referring to FIGS. 2 and 3E, at step 114, both photoresist layer 238 and dielectric layer 236, as shown in FIG. 3E, are stripped from device 200. Because these two layers are formed from different materials, different stripping techniques may be employed, in some embodiments. Once layers 238 and 236 are removed, a single void 244 remains through OSG layers 230 and 226 exposing an upper surface of conductor 222. Note that void 244 includes two portions, one with a narrower width closer to conductor 222 as between the etched portions of OSG layer 226 and another with a wider width as between the etched portions of OSG layer 230 and away from conductor 222. This double-tier structure is the result of a conventional dual damascene process.

Figure 3F:
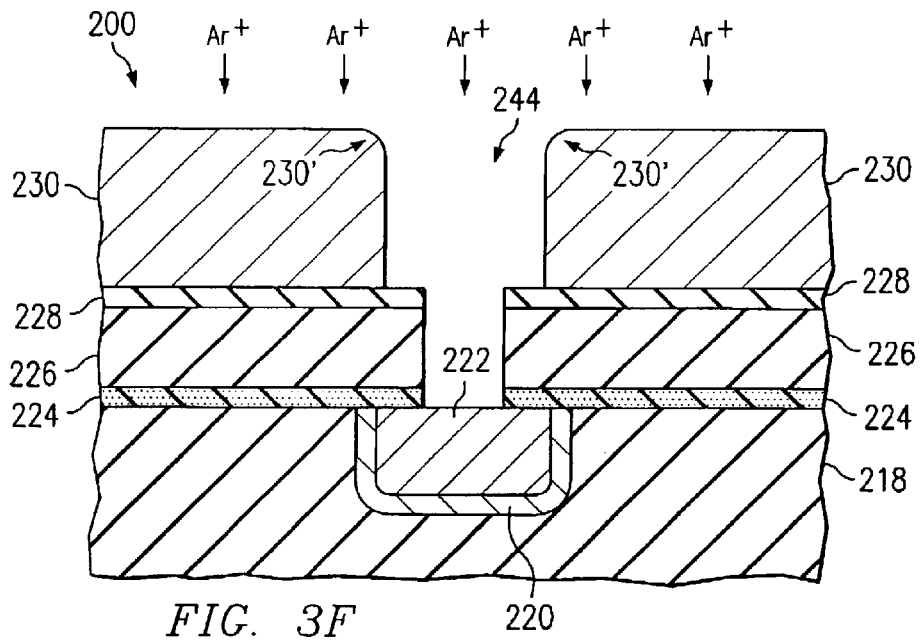

Referring to FIGS. 2 and 3F, at step 116, device 200 may be exposed to argon. In one embodiment, an argon sputter etch process may be used; however, any suitable process for argon exposure may also be used. Argon sputter etch process is typically achieved in a sputter etch chamber where the argon ions are accelerated onto the wafer in which device 200 is formed. The argon exposure of step 116 is perceived to have various benefits for some embodiments of the invention. First, the argon cleans various contaminants that are likely to remain on the upper surface of conductor 222, as resulting from preceding steps of method 100. Such contaminants may include etch residue and polymers from previous etches, as well as copper oxide in the case where conductor 222 is copper. Second, the argon sputter will slightly round the inward edges of OSG layer 230, where such edges are shown as 230' in FIG. 3F. For reasons described below, such rounding may be beneficial in certain embodiments. Although argon exposure is shown as one example method of rounding the edges, any suitable method of rounding the edges may be used. The necessity as well as duration of step 116 may be adjusted based on various parameters, including whether the void is formed by a single or dual damascene process. In one embodiment where the amount of contaminants is negligible, step 116 may be omitted.

Figure 3G:
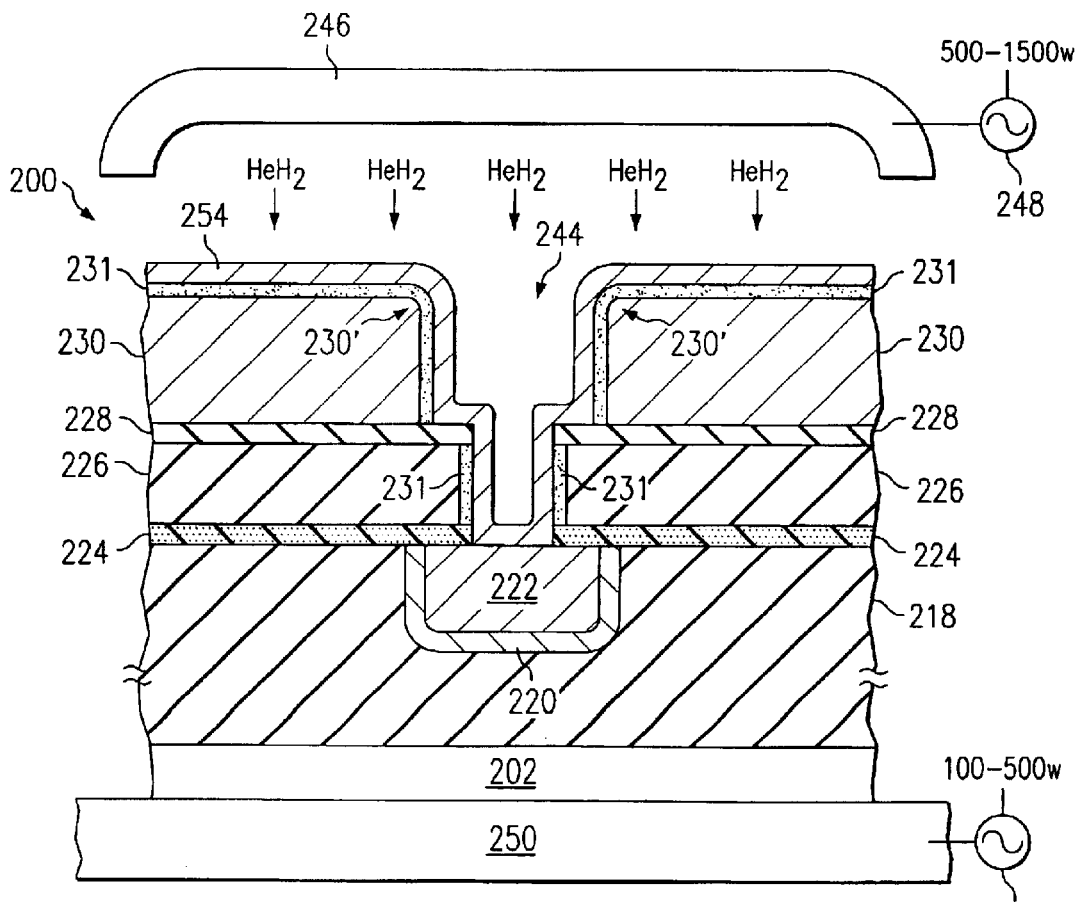

Referring to FIGS. 2 and 3G, at step 118, a barrier layer 254 is formed overlying OSG layer 230 and lining the walls of void 244, as shown in FIG. 3G. Barrier layer 254 may be formed from any suitable metallic or non-metallic material. An example material for forming barrier layer 254 is tantalum. At this step, the barrier layer 254 is thin enough for penetration of plasma. In one embodiment, the thickness of barrier layer 254 is approximately equal to or less than 10 angstroms; however, any thickness that allows sufficient penetration by plasma at a power level that does not cause damage to device 200 may be used. In one embodiment, as described below in conjunction with step 121, the thickness of barrier layer 254 may be increased.

After the formation of barrier layer 254 at step 118, barrier layer 254 is exposed directly or indirectly to plasma at step 120 so that plasma reaches underlying OSG layer 230. As used herein, "reaching" a layer refers to affecting the layer, such as OSG layer 230, to a particular depth 231 through an intermediate layer, such as barrier layer 254, so that adhesion between the affected layer and the intermediate layer is improved. For example, when plasma penetrates barrier layer 254 to reach OSG layer 230, some mechanical interlocking may be established at the interface between barrier layer 254 and OSG layer 230 to improve adhesion between layers 254 and 230. The same may also occur at the interface between barrier layer 254 and portions of OSG layer 226 in direct contact with barrier layer 254. As used herein, "directly" exposing plasma to a layer refers to exposing the layer to plasma without positioning an intermediate layer between the source of plasma and the exposed layer, as shown in FIG. 3G.

In some embodiments, improving adhesion between barrier layer 254 and adjoining OSG layer 230 or 226 (see the interface between barrier layer 254 and inner walls of void 244, for example) by plasma exposure during or after the formation of barrier layer 254 is advantageous for numerous reasons. For example, adhesion improvement processes using pre-clean processes may cause increased linewidth—thus reducing spacing—and high capacitance if not controlled properly. However, some embodiments of the present invention may avoid such problems because depth 231 of plasma penetration into OSG layers 230 or 226, as shown in FIG. 3G, is moderated by barrier layer 254.

Plasma treatment of step 120 may be implemented using any suitable system, such as a CVD chamber having a chamber coil 246 coupled to a power source 248, as shown in FIG. 3G. Chamber coil 246 is operable to form plasma. In one embodiment, plasma comprises He and $H_2$, where the percentage of each of the two may vary. For example, in one embodiment, plasma may include 95% He and 5% $H_2$; however, any suitable proportion of any suitable material may be used as plasma, such as Ar plasma, N2 plasma or mixtures of Ar—N2, Ar—H2 etc. In one embodiment, to expose barrier layer 254 to plasma, plasma is ionized by applying power from power source 248 to chamber coil 246. Such ionization drives plasma through barrier layer 254 and into depth 231 of OSG layers 230 and/or 226.

OSG layers 230 and/or 226 may be reached to depth 231 through barrier layer 230 by selecting a suitable power level applied to chamber coil 246. The selection may be made depending on the thickness of barrier layer 254. Less power is required when barrier layer 254 is thinner. In one embodiment, plasma exposure may be implemented at a power level between approximately 500 to 1500 watts. However, any suitable power level sufficient to penetrate through barrier layer 254 and reach the underlying portions of layers 230 and 226 may be used. In one embodiment, any one of the following power levels may be used for plasma exposure of layer 254: 500 watts, 550 watts, 600 watts, 650 watts, 700 watts, 750 watts, 800 watts, 850 watts, 900 watts, 950 watts, 1000 watts, 1050 watts, 1100 watts, 1150 watts, 1200 watts, 1250 watts, 1300 watts, 1350 watts, 1400 watts, 1450 watts, and 1500 watts.

In one embodiment, desired depth 231 of a dielectric layer, such as OSG, layers 230 and/or 226, that is affected by plasma exposure may be controlled by the length of plasma exposure. For example, where one angstrom of a dielectric layer is affected for each second of plasma exposure at a particular power level, and a total of ten angstroms of affected depth is desired, the overall plasma exposure time may be ten seconds. In one embodiment, a lower power level may be used where the exposure duration is extended. This is advantageous because the potential for damaging a semiconductor device by subjecting the device to a high-power plasma exposure is reduced.

In one embodiment, plasma provided by chamber coil 246 may be accelerated towards substrate 202 to facilitate the penetration of barrier layer 254 by positioning device 200 so that substrate 202 is near an electrode, such as a pedestal 250 of a CVD chamber. The acceleration of plasma may be implemented by applying power to pedestal 250 using a power source 252 coupled to pedestal 250 so that plasma may be effectively "pulled" towards pedestal 250. In one embodiment, the level of power applied to pedestal 250 may be between 100 to 500 watts; however, any suitable power level may be used to accelerate plasma towards pedestal 250 depending on the overall thickness of device 200, the power level applied to chamber coil 246, and the type of material used as dielectric layers 230 and/or 226. This is advantageous in some embodiments because a lower level of power may be used to achieve the same adhesion effects at the interface between a dielectric layer and a metal layer.

In one embodiment, a CVD chamber that is used to form barrier layer 254 may also be used to provide plasma exposure to layer 254. One example of a CVD chamber is TxZ, available from Applied Materials Corporation; however, any suitable CVD chamber may be used. Using the same CVD chamber for both the formation of a barrier layer and plasma treatment for adhesion improvement is advantageous because adhesion improvement may be provided using existing equipment, which reduces manufacturing cost. Further, improved adhesion may be achieved without complicating the manufacturing process.

At step 121, thickness of barrier layer 254 may be increased. The thickness may be increased by forming an additional barrier layer over barrier layer 254, in one embodiment. This may improve barrier layer's 254 ability to block diffusion of conductor, such as Cu, into OSG. In one embodiment, the total thickness of barrier layer 254 may be approximately 250 angstroms as a result of performing step 121; however, any suitable thickness may be used depending on the design specifications of device 200. For example, the total thickness of barrier layer 254 may be 50 angstroms. In some embodiments, step 121 may be omitted.

Figure 3H:
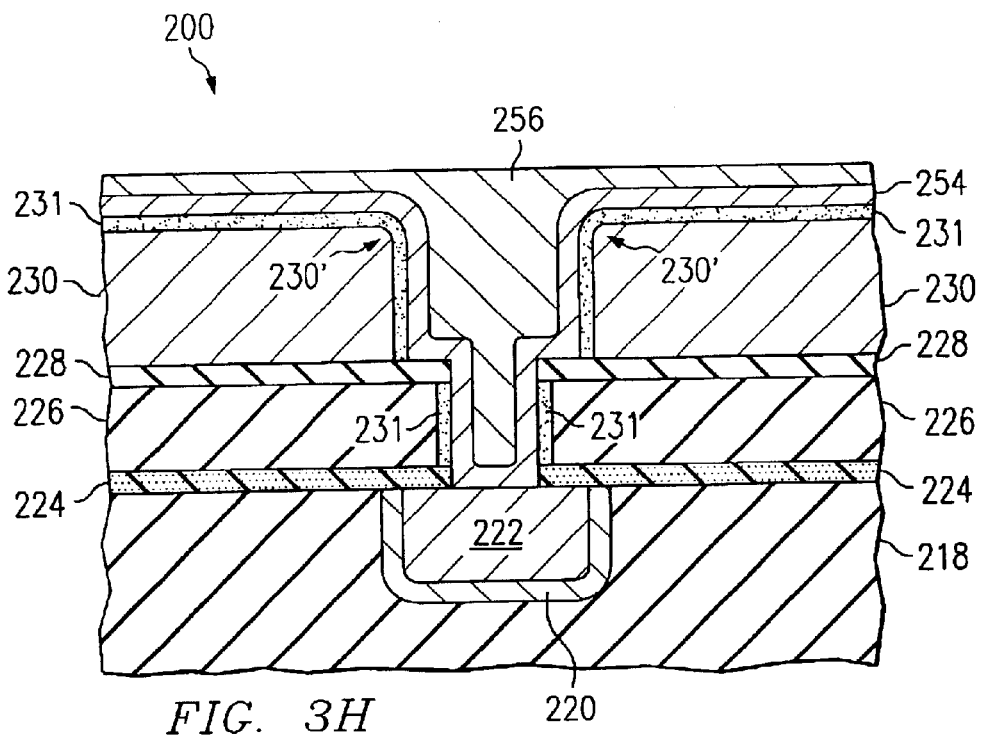

Referring to FIGS. 2 and 3H, at step 123, a metal layer 256 is formed over device 200, extending into what was shown as void 244 in the preceding FIG. 3G. In one embodiment, metal layer 256 is copper, and it is formed by first providing a copper seed layer (not separately shown) in void 244 and on top of barrier layer 254, and following the copper seed layer with a copper plating step. In connection with these layers, recall that the argon step 116 above was stated to be favorable in causing rounded edges 230'. Without such edges 230', the inclusion of barrier layer 254 as well as a copper seed layer would otherwise tend to converge on or pinch off the vertical opening in void 244 and, as a result, the subsequent metal layer 256 may not fully fill that area—such a result is sometimes referred to as creating a cavity within the metal layer. However, as shown in FIG. 3H, the entire void 244 is filled by metal layer 256 because rounded edges 230' permit a thorough filling of void 244 by metal layer 256. It may be further seen that barrier layer 254 provides a barrier between metal layer 256 and the OSG layers 230 and 226. Thus, in the example where metal layer 256 is copper, then barrier layer 254 prevents copper diffusion of metal layer 256 into OSG layers 230 and 226.

Figure 3I:
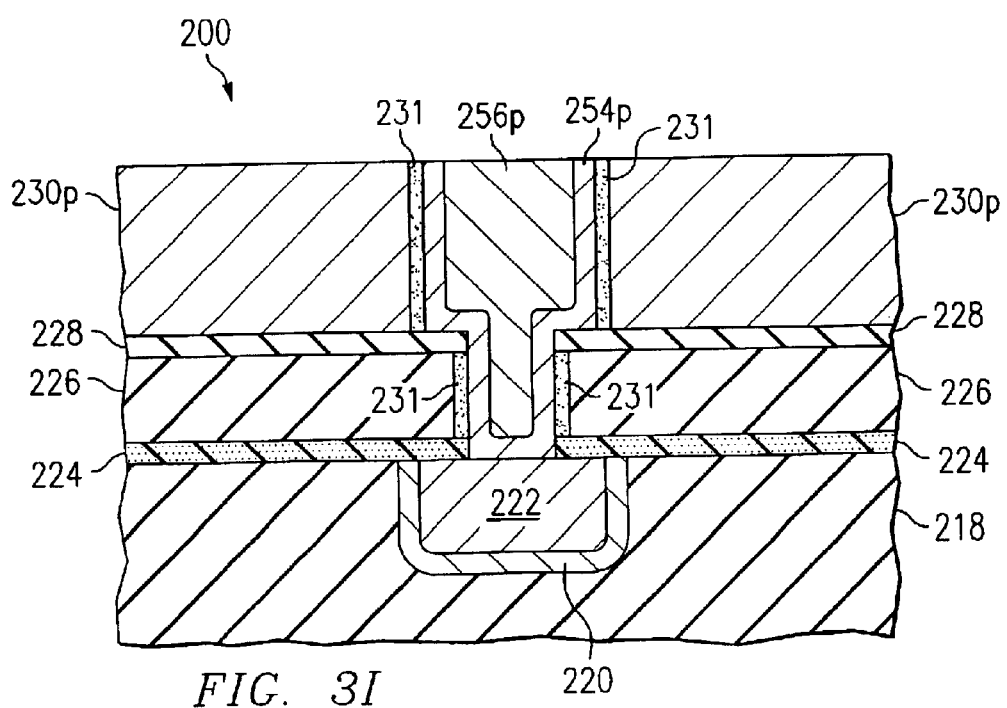

Referring to FIGS. 2 and 3I, at step 124, device 200 is planarized, such as with a chemical mechanical polishing ("CMP") operation. For sake of reference, the layers affected by the planarization are shown with a subscript "P" in their reference numbers. Thus, following the planarization, OSG layer 230 becomes an OSG layer $230_P$, metal barrier layer 254 becomes metal barrier layer $254_P$, and metal layer 256 becomes metal layer $256_P$. Accordingly, from the resulting structure of device 200 in FIG. 3I, electrical contact may be made to metal layer $256_P$, thereby also electrically connecting to metal conductor 222. In one embodiment, the depth of OSG layer 230 affected by the plasma exposure of step 120 is either partially or entirely removed by the CMP operation of step 124 and, thus, any effects of that treatment along the upper horizontal surface of OSG layer 230 are effectively removed by the CMP. However, below that surface, there is still improved adhesion between OSG layer $230_P$ and metal barrier $254_P$.

Although some embodiments of methods for providing improved adhesion between layers of a semiconductor device have been described using a dual damascene structure, the teachings of the present invention may be used to improve adhesion between any suitable portions of a semiconductor device.

Although some embodiments of the present invention have been described in detail, it should be understood that various changes, substitutions, and alterations can be made hereto without departing from the spirit and scope of the invention as defined by the appended claims.

What is claimed is:

1. A method for providing adhesion between a plurality of layers in a semiconductor device, comprising:

forming a first layer comprising organo-silicate glass, the first layer overlying a base layer having a conductive portion;

forming a trench in the first layer, the trench at least partly overlying the conductive portion;

lining the trench with a second layer comprising titanium silicon nitride approximately 10 Angstroms thick, the second layer in direct contact with and overlying the first layer;

after lining the trench with the second layer, directly exposing the second layer to plasma at a first power level between approximately 500 to 1500 watts, the first power level sufficient for plasma to reach the first layer through the second layer; and after directly exposing the second layer, forming a third layer in the trench, the third layer in direct contact with and overlying the second layer.

2. The method of claim 1, wherein the base layer is overlying an electrode, and further comprising applying power to the electrode while directly exposing the second layer to plasma and while exposing the third layer to plasma.

3. The method of claim 1, wherein the first layer has a top surface, and wherein the trench has at least two approximately vertical walls each adjoining a particular portion of the top surface.

* * * * *